United States Patent [19]
Chang et al.

[11] Patent Number: 5,736,415
[45] Date of Patent: Apr. 7, 1998

[54] METHOD FOR MANUFACTURING INPUT/OUTPUT PORT DEVICES HAVING LOW BODY EFFECT

[75] Inventors: Ming-Chien Chang, Hsinchu; Wuu-Larng Laih, Chiai Hsien, both of Taiwan

[73] Assignee: Vanguard International Semiconductor, Corporation, Hsinchu, Taiwan

[21] Appl. No.: 810,075

[22] Filed: Mar. 4, 1997

[30] Foreign Application Priority Data

May 11, 1996 [TW] Taiwan .................... 85113488

[51] Int. Cl.⁶ .................... H01L 21/265
[52] U.S. Cl. .................... 437/27; 437/45; 437/56; 437/52
[58] Field of Search .................... 437/27, 45, 56, 437/52, 34, 57

[56] References Cited

U.S. PATENT DOCUMENTS

| | | | |
|---|---|---|---|
| 5,005,477 | 4/1991 | Farb | 437/34 |
| 5,011,784 | 4/1991 | Ratnakumar | 437/57 |
| 5,141,890 | 8/1992 | Haken | 437/57 |

*Primary Examiner*—Jey Tsai
*Attorney, Agent, or Firm*—Fish & Richardson P.C.

[57] ABSTRACT

A method for manufacturing input/output port devices of a semiconductor circuit having low body effect, suitable for use on a semiconductor substrate on which a plurality of pull-up device regions and pull-down device regions are formed. First, when executing a channel implantation, an anti-punchthrough implantation, and a threshold adjustment implantation, a mask which masks PMOS devices in the CMOS process is used to mask pull-up device regions on a semiconductor substrate. Furthermore, when executing a cell implantation, a mask which masks the outside regions of memory cells is used to mask pull-down device regions. In the invention, the body effect of pull-up devices on the input/output port is reduced without using any extra mask and under the original process, thereby lowering the threshold voltage and reducing the output voltage drop.

10 Claims, 3 Drawing Sheets

METHOD FOR MANUFACTURING INPUT/ OUTPUT PORT DEVICES HAVING LOW BODY EFFECT

BACKGROUND OF THE INVENTION

1. Field of the Invention

The invention relates to a semiconductor process, and more particularly to a semiconductor process of a dynamic random access memory (DRAM) having low body effect on an input/output port.

2. Brief Description of the Prior Art

Dynamic random access memories (hereinafter referred to as "DRAMs") are well-known and are widely applied in the semiconductor industry. Each memory cell of a DRAM consists of transistors and storage capacitors. A DRAM is fabricated in an array, which is formed by memory cells, and a peripheral circuit. In most advanced process technologies, the memory cell array in the DRAM is generally produced by an NMOS process technology. The peripheral circuit is generally produced by a CMOS process technology. That is, the DRAM is fabricated by a hybrid NMOS/CMOS process technology. However, the memory cell array is still fabricated within a common well region of a CMOS wafer. There are two advantages to the hybrid NMOS/CMOS process technology for the DRAM. One advantage is that the chip area required by the memory cell array is reduced by using the CMOS process technology; another advantage is that the peripheral circuit produced by using the CMOS process technology can operate at a lower working voltage, thus conserving power consumption.

Latchup is a common destruction mode problem which considerably affects the life time and reliability of integrated circuits. A path of lowest resistance appearing between an external high-voltage source and low-voltage source causes the latchup problem. The lowest resistance path results in a large amount of current passing through the internal electrodes of devices, resulting in the devices being destroyed. In general operation, the drain of a PMOS transistor in a CMOS is connected to the high voltage source and the source of a NMOS transistor in the CMOS is connected to the low voltage source. Furthermore, parasitic transistors in parallel mode having positive/negative feedback are formed within the bodies of the PMOS and NMOS devices cause latchup. To reduce the reliability problem caused by the above described latchup phenomenon, pull-up devices and pull-down devices in the form of NMOS transistors are formed on the input/output port of a general DRAM.

However, pull-up devices formed by NMOS transistors have disadvantages in practical operation. The potential difference between the input voltage on the gates and the output voltage on the sources of NMOS transistors is at least the same as the threshold voltage of NMOS transistors. The potential difference is known through the basic operations of NMOS transistors. The working characteristic of NMOS devices will be briefly described: When the gate voltage $V_{GS}$ is smaller than the threshold voltage $V_{TH}$, NMOS devices are in an "off" state and no current flows through the channels between sources and drains. However, when the gate voltage $V_{GS}$ is larger than the threshold voltage $V_{TH}$, NMOS devices are in an "on" state and current flows through the channels between sources and drains. In the "on" state, a linear region working point can be defined as the drain-source voltage $V_{DS}$ being less than gate-source voltage $V_{GS}$ minus the threshold voltage $V_{TH}$. At the above-mentioned linear region working point, the drain current $I_D$ is linearly related to the drain-source $V_{DS}$ voltage. A saturated region working point can be defined by the point at which the drain-source voltage $V_{DS}$ is greater than the gate-source $V_{GS}$ minus the threshold voltage $V_{TH}$. At the saturated region working point, the drain current $I_D$ is not related to drain-source voltage $V_{DS}$ and has a square relation with the value of the gate voltage $V_{GS}$ minus the threshold voltage $V_{TH}$. Since pull-up devices formed by NMOS transistors in the DRAM operate at the above-referred saturated region working point, the gate-source $V_{GS}$ must be larger than the threshold voltage $V_{TH}$. That is, the potential difference between gates and sources must be larger than the threshold voltage $V_{TH}$. Thus, in the DRAM, the threshold voltage $V_{TH}$ will cause low output voltage.

Basically, the design of pull-up devices on the input/output port of the DRAM are almost the same as those of other devices in the peripheral circuit. However, one difference is that the channel length of the NMOS transistor pull-up devices is longer than that of the devices in the peripheral circuit. This results in the NMOS transistors pull-up devices having a higher body effect producing a rising threshold voltage. In other words, if the output voltage of the DRAM is a high level voltage ($V_{OH}$), lowering the voltage value may cause logic errors due to an insufficient output level voltage.

Accordingly, users desire the logic high level voltage ($V_{OH}$) of the DRAM to be as high as possible with a value very close to that of the high voltage source of the DRAM. The greater the value of the logic high level voltage $V_{OH}$, the greater the noise immunity of the output logic voltage of the DRAM. This leads to the possibility of reducing the number of logic errors generated during operation of the DRAM. A boost circuit is often used to raise the logic high level voltage $V_{OH}$. Although the boost circuit can raise the high level voltage $V_{OH}$, it has a relatively complicated structure and requires greater chip space area. Thus, in view of the trend toward providing small, high integrity DRAM products, use of such boost circuits may not meet production requirements for future applications. For current DRAM products, the output logic high level voltage $V_{OH}$ at a specific output current (i.e., drain current $I_D$) is an important parameter of DRAM products. The higher the value of the output logic high-level voltage $V_{OH}$, the more attractive the DRAM products. Thus, the ability to raise the logic high level voltage $V_{OH}$ without entailing extra circuitry requiring additional chip space area is an important issue in the chip manufacturing industry.

SUMMARY OF THE INVENTION

Based on the above, the object of the invention is to provide a method for manufacturing input/output port devices of a semiconductor circuit and, in particular, a method for manufacturing pull-up devices and pull-down devices on the input/output port for a DRAM having a higher logic high-level voltage $V_{OH}$, thereby enhancing the noise immunity of the semiconductor circuit.

Another object of the invention is to provide a method for manufacturing the input/output port devices of a semiconductor circuit, and more particularly to a method for manufacturing pull-up devices and pull-down devices on the input/output port for a DRAM without the need for an extra boost circuit and process, while achieving the purpose of raising the logic high-level voltage $V_{OH}$.

According to above-referred objects, the invention provides a manufacturing method for reducing body effect on input/output port devices and is suitable for a semiconductor substrate on which pull-up devices and pull-down devices on the input/output port of a DRAM are formed. The manufacturing method will be described hereinafter. First, when executing a channel stop implantation, pull-up device regions on a semiconductor substrate are masked and pull-down regions are left unmasked by using a mask that is typically used for masking other device regions of other type pull-down devices in the CMOS process. For example, the mask used in this NMOS/CMOS manufacturing process is one typically used for forming PMOS devices in an N-well or tub region. Second, when executing an anti-punchthrough implantation, pull-up device regions are masked and pull-down device regions are unmasked by using the same mask. Third, when executing a threshold adjustment implantation, pull-up device regions on the semiconductor substrate are masked and pull-down device regions are unmasked by using the same mask. Last, when executing a cell implantation, pull-down device regions are masked and pull-up device regions are unmasked by using another mask which is a cell mask for masking the external regions of memory cells. With this manufacturing method, no extra mask is required. Moreover, the body effect of pull-up devices on the input/output port is effectively reduced and the threshold voltage is decreased, thereby attaining the purpose of reducing the output voltage from dropping.

BRIEF DRAWINGS OF THE INVENTION

The objects, characteristics, and advantages of the present invention will be explained by using a preferred embodiment with pertinent drawings as follows.

DETAILED EMBODIMENT OF THE INVENTION

Figure 1:
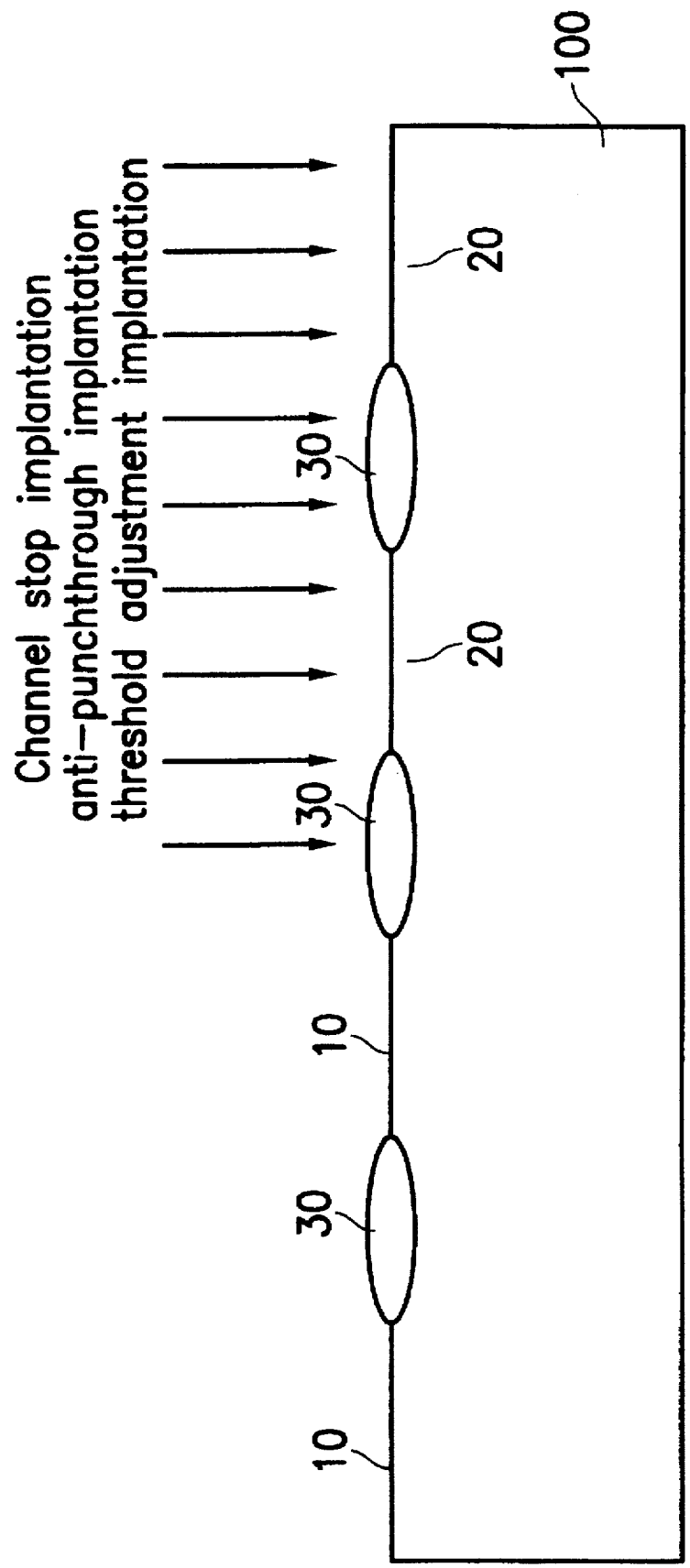
FIG. 1 is a cross-sectional view showing a pull-up device and a pull-down device on an input/output port during execution of a channel stop implantation, an anti-punchthrough implantation, and a threshold adjustment implantation according to one embodiment of the invention.

A method for lowering the body effect on an input/output port device according to the invention primarily involves executing a channel stop implantation, an anti-punchthrough implantation, a threshold adjustment implantation and a cell implantation.

In general MOS processes, the channel stop implantation is executed before the step in which field oxides are formed by thermal oxidation. The purpose of the channel stop implantation is to enhance the insulation effect among devices. The anti-punchthrough implantation and the threshold adjustment implantation are executed after the step in which field oxides are formed. The purpose of the anti-punchthrough implantation is to prevent reverse bias between the drains and bodies of MOS devices which can cause punch-through. The purpose of the threshold voltage implantation is to adjust the body impurity concentration under the gates of MOS devices, thereby adjusting the threshold voltage. However, in certain CMOS processes, for example, the twin-well process, the channel stop implantation and the anti-punchthrough implantation can be performed simultaneously by executing well implantation of a P-type well and an N-type well. That is, the invention is not limited to just using separate processes to achieve the channel stop implantation and the anti-punchthrough implantation. In a DRAM process, because MOS devices in memory cells have higher threshold voltages than MOS devices in peripheral circuits, cell implantation is executed to adjust the threshold voltage of MOS devices in memory cells after executing the threshold voltage implantation. Furthermore, the means and order of executing above-referred implantation are not limited in the invention.

Based on practical measurements, the body effect of a pull-up transistor and a pull-down transistor on the input/output port mainly results from the steps of channel stop implantation and anti-punchthrough implantation. The above-mentioned implantations increase the body effect of the pull-up transistor and results in an increase of the threshold voltage. Hence, it is necessary to reduce implantation concentration in order to lower the threshold voltage of the pull-up transistor. In a standard CMOS process, the channel stop implantation, anti-punchthrough implantation, and threshold adjustment implantation are individually executed on a P-type well region and an N-type well region. That is, a PMOS device region is masked when an NMOS device, disposed on the P-type well region, undergoes the above-referred implantations, and vice versa. In addition, all the implantations mentioned above employ the same mask. The material, implantation concentration, and implantation energy of the general channel stop implantation are B11, 3E12 atoms/cm$^2$, and 180 KeV, respectively. The material, implantation concentration, and implantation energy of the general anti-punchthrough implantation are B11, 2E12 atoms/cm$^2$ and 120 KeV, respectively, wherein the material, implantation concentration, and implantation energy of the threshold adjustment implantation are BF$_2$, 1.4E12 atoms/cm$^2$, and 50 KeV, respectively. Moreover, the cell implantation is executed by using another mask, which covers all device regions except the regions of the DRAM memory cells, wherein the material, implantation concentration, implantation energy of the cell implantation are BF$_2$, 2E12 atoms/cm$^2$, and 50 KeV.

Figure 2:
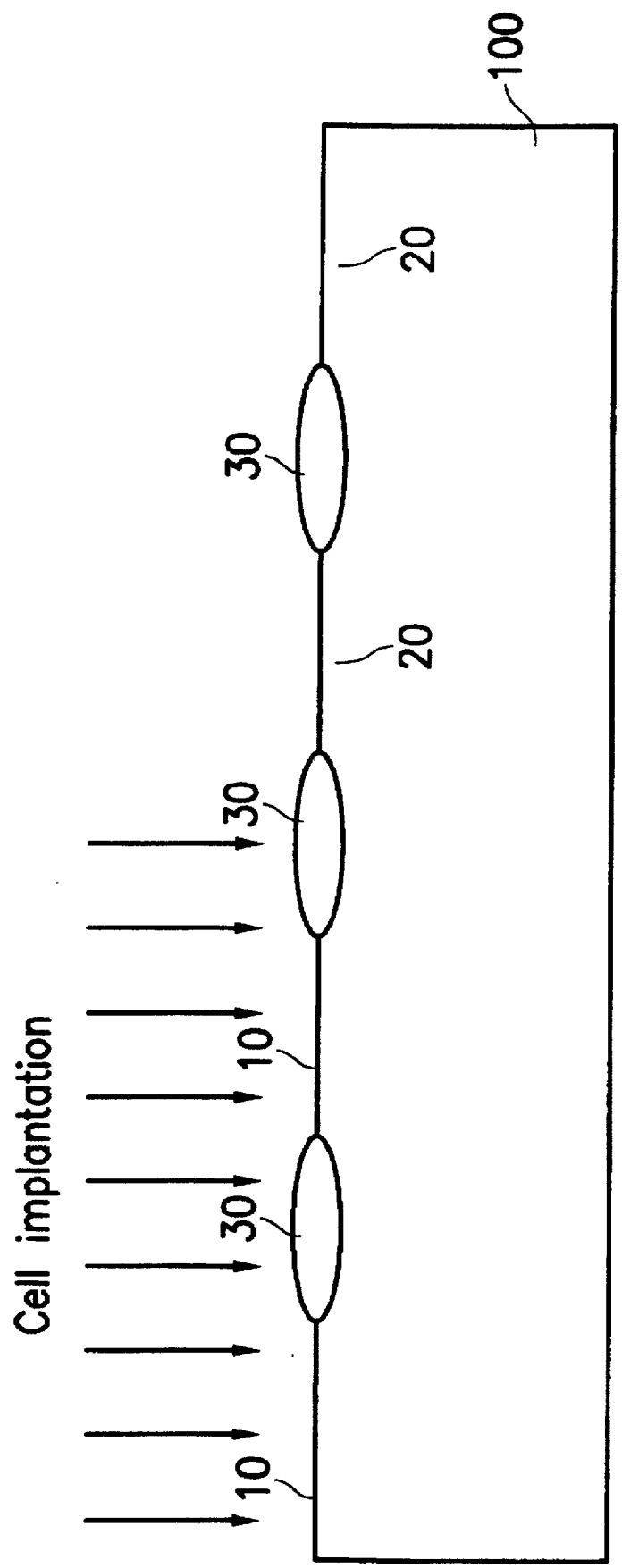
FIG. 2 is a cross-sectional view showing the pull-up device and pull-down device on the input/output port when executing a cell implantation according to the embodiment of the invention.

Referring to FIG. 1 and FIG. 2, the following implantation approach will be adopted without changing the original process conditions: When executing the channel stop implantation, pull-up transistor regions 10 of a semiconductor substrate 100 are masked and pull-down transistor regions 20 are exposed. Next, when executing the anti-punchthrough implantation, pull-up transistor regions 10 on the semiconductor substrate 100 are masked and pull-down transistor regions 20 are exposed. Lastly, when executing threshold adjustment implantation, pull-up transistor regions 10 on the semiconductor substrate 100 are masked and pull-down transistor regions 20 are exposed. In the above-mentioned implantation steps, a mask is used for masking pull-up transistor regions 10 with field oxides 30 providing insulation between transistors. However, it should be noted that field oxides 30 are not formed during the implantation steps mentioned above. Although FIG. 1 shows one pull-up transistor and one pull-down transistor, it is not intended to limit the number of the pull-up transistors and pull-down transistors. Furthermore, when executing the cell implantation shown in FIG. 2, pull-down transistor region 20 on the semiconductor substrate 100 is masked and pull-up transistor regions 10 are exposed by using a different mask. This different mask is a cell mask which covers outside regions of the memory cells. Since the cell implantation has a lower implantation concentration and implantation energy, a reduction of the body effect is attained. In the embodiment of the invention, the body effect of the pull-up device on the input/output port is reduced without using an extra mask and under the original process, so that the threshold voltage is lower and the output voltage drop is reduced.

Figure 3:
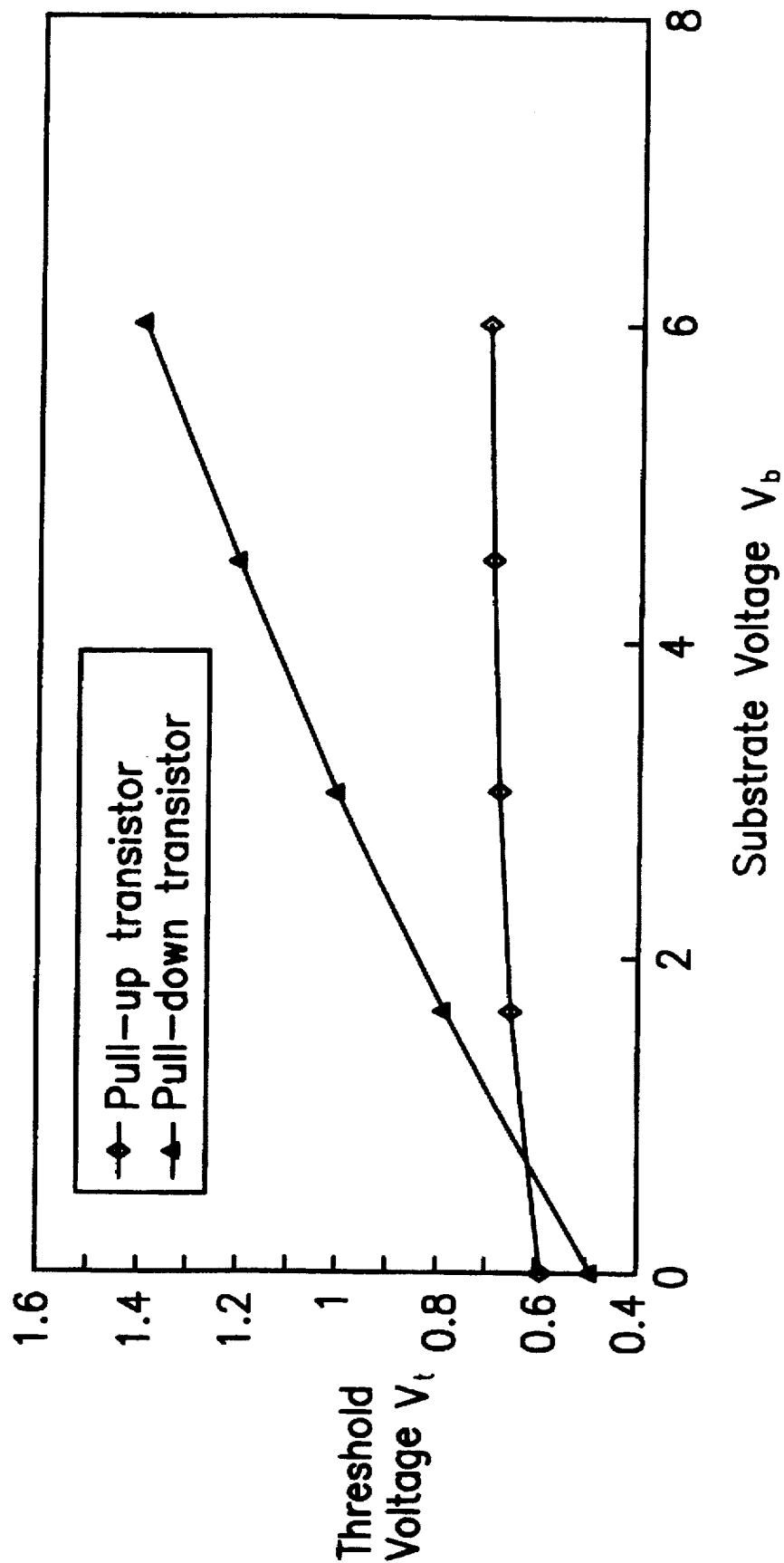
FIG. 3 is a graph showing the relationship between the threshold voltage and substrate voltage for the pull-up devices and pull-down devices.

FIG. 3 is a graph showing the relationship between the threshold voltage and substrate voltage for a pull-up transistor and a pull-down transistor formed according to the embodiment of the invention with the drain voltage being about 0.1V. The following table shows threshold voltage values for the pull-up transistor and pull-down transistor measured when the substrate voltage Vb is set at about 0V, 1.5V, 3V, 4.5V, and 6V.

TABLE

| Substrate Voltage Vb (V) | Pull-up transistor threshold Voltage (V) | Pull-down transistor threshold Voltage (V) |
|---|---|---|
| 0 | 0.582 | 0.485 |
| 1.5 | 0.67 | 0.812 |
| 3 | 0.702 | 1.05 |
| 4.5 | 0.727 | 1.26 |
| 6 | 0.748 | 1.45 |

In this case, pull-down transistor regions, fabricated by using a prior art method, demonstrate a stronger body effect and higher threshold voltage due to executing the channel stop implantation, anti-punchthrough implantation, and threshold adjustment implantation. On the other hand, pull-up transistor regions demonstrate a weaker body effect and lower threshold voltage due to just executing the cell implantation. Although, in the above described embodiment, pull-down transistor regions are fabricated using the prior art method, the pull-down transistor regions can use the same mask as pull-up transistor regions to attain a low threshold voltage.

The method for manufacturing input/output port devices of a semiconductor circuit having low body effect provides two advantages as follows:

1. The body effect of pull-up transistors on the input/output port of a memory chip is effectively lowered and the threshold voltage of the transistors is also reduced. In the above embodiment, the logic high level voltage $V_{OH}$ rises from 2.4V to 2.8V.

2. The objects of the invention are attained without significantly changing process conditions. In the process of the above embodiment, the channel stop implantation, anti-punchthrough implantation, threshold adjustment implantation, and cell implantation may be performed using implantation conditions of the original process. Hence, the invention is suitable for wide application in the semiconductor industry. Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A method for manufacturing the input/output port devices of a semiconductor circuit having low body effect, suitable for use on a semiconductor substrate on which a plurality of pull-up device regions and pull-down device regions are formed, comprising:

masking said pull-up device regions of a first conductivity type on said semiconductor substrate and then executing a channel stop implantation;

masking said pull-up device regions on said semiconductor substrate and then executing a anti-punchthrough implantation;

masking said pull-up device regions on said semiconductor substrate and then executing a threshold adjustment implantation; and exposing said pull-up device regions on said semiconductor substrate and then executing a cell implantation.

2. The method for manufacturing the input/output port device of a semiconductor circuit having low body effect as claimed in claim 1 wherein during executing said channel stop implantation, a mask which masks device regions of said pull-up device regions and said pull-down device regions of a second, different conductivity type in the CMOS process is used to mask said pull-up device regions of the first conductivity type on said semiconductor substrate.

3. A method for manufacturing the input/output port device of a semiconductor circuit having low body effect as claimed in claim 1 wherein during executing said anti-punchthrough implantation, a mask which masks device regions of said pull-up device regions and said pull-down device regions of a second different conductivity type in the CMOS process is used to mask said pull-up device regions of the first conductivity type on said semiconductor substrate.

4. A method for manufacturing the input/output port device of a semiconductor circuit having low body effect as claimed in claim 1 wherein during executing said threshold adjustment implantation, a mask which masks device regions of said pull-up device regions and said pull-down device regions of a second different conductivity type in the CMOS process is used to mask said pull-up device regions of the first conductivity type on said semiconductor substrate.

5. A method for manufacturing the input/output port device of a semiconductor circuit having low body effect as claimed in claim 1 wherein during executing said cell implantation, a mask which masks a plurality of outside regions of memory cells is used to expose said pull-up device regions on said semiconductor substrate.

6. A method for manufacturing the input/output port device of a semiconductor circuit having low body effect as claimed in claim 1 wherein said pull-up devices and said pull-down devices are N-type CMOS transistors.

7. A method for manufacturing the input/output port device of a semiconductor circuit having low body effect as claimed in claim 6, wherein during executing said channel stop implantation, a mask which masks P-type MOS transistor regions in the CMOS process is used to mask said pull-up device regions on said semiconductor substrate.

8. A method for manufacturing the input/output port device of a semiconductor circuit having low body effect as claimed in claim 6, wherein during executing said anti-punchthrough implantation, a mask which masks P-type MOS transistor regions in the CMOS process is used to mask said pull-up device regions on said semiconductor substrate.

9. A method for manufacturing the input/output port device of a semiconductor circuit having low body effect as claimed in claim 6, wherein during executing said threshold adjustment implantation, a mask which masks P-type MOS transistor regions in the CMOS process is used to mask said pull-up device regions on said semiconductor substrate.

10. A method for manufacturing the input/output port device of a semiconductor circuit having low body effect as claimed in claim 6, wherein during executing said cell implantation, a mask which masks a plurality of outside regions of said memory cells is used to expose said pull-up device region on said semiconductor substrate.

* * * * *